United States Patent
Sasahata et al.

(10) Patent No.: US 8,659,053 B2
(45) Date of Patent: Feb. 25, 2014

(54) SEMICONDUCTOR LIGHT DETECTING ELEMENT

(75) Inventors: Yoshifumi Sasahata, Tokyo (JP); Eitaro Ishimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/596,561

(22) Filed: Aug. 28, 2012

(65) Prior Publication Data

US 2013/0207160 A1 Aug. 15, 2013

(30) Foreign Application Priority Data

Feb. 9, 2012 (JP) .................................. 2012-026150

(51) Int. Cl.
| | | |
|---|---|---|
| *H01L 31/107* | (2006.01) | |
| *H01L 31/102* | (2006.01) | |
| *H01L 31/06* | (2012.01) | |
| *H01L 21/00* | (2006.01) | |

(52) U.S. Cl.
USPC ........... 257/186; 257/184; 257/189; 257/201; 257/E31.063; 438/48; 438/57; 438/91

(58) Field of Classification Search
None
See application file for complete search history.

(56) References Cited

U.S. PATENT DOCUMENTS

| | | | | |
|---|---|---|---|---|
| 4,651,187 | A | * | 3/1987 | Sugimoto et al. ............. 257/186 |
| 6,501,776 | B1 | | 12/2002 | Numai |
| 2011/0204214 | A1 | * | 8/2011 | Bahir et al. ................. 250/214.1 |
| 2011/0303949 | A1 | * | 12/2011 | Sasahata et al. ............. 257/184 |

FOREIGN PATENT DOCUMENTS

| | | |
|---|---|---|
| JP | 9-8405 A | 1/1997 |
| JP | 11-68238 A | 3/1999 |
| JP | 2000-223787 A | 8/2000 |
| JP | 2004-221413 A | 8/2004 |

OTHER PUBLICATIONS

S. J. Maddox Molecular Beam Epitaxy Growth-Space Investigation of InAsBi and InGaAsBi on InAs, 2012, ECE Department, The University of Texas at Austin, Austin, Texas 78758.*
High Quantum Efficiency and Narrow Absorption Bandwidth of the Wafer-Fused Resonant Ino. 53Gao .47As Photodetectors, I-Hsing Tan, James J. Dudley, Dubravko l. BabiC, Daniel a. Cohen, Bruce D. Young, Evelyn L. Hu, John E. Bowers, B. I. Miller, U. Koren, and M. G. Young, IEEE Photonics Technology Leiters, vol. 6, No. 7, Jul. 1994.*
Lowloss InGaAs/InP multiple quantum well optical electroabsorption waveguide modulator U. Koren, B. I. Miller, T. L. Koch, G. Eisenstein, R. S. Tucker, I. BarJoseph, and D. S. Chemla Applied Physics Letters 51, 1132 (1987); doi: 10.1063/1.98761.*

* cited by examiner

*Primary Examiner* — Yasser A Abdelaziez
*Assistant Examiner* — Harpreet Singh
(74) *Attorney, Agent, or Firm* — Leydig, Voit & Mayer, Ltd.

(57) ABSTRACT

A semiconductor light detecting element includes: an InP substrate; and a semiconductor stacked structure on the InP substrate and including at least a light absorbing layer, wherein the light absorbing layer includes an InGaAsBi layer lattice-matched to the InP substrate.

13 Claims, 6 Drawing Sheets

SEMICONDUCTOR LIGHT DETECTING ELEMENT

BACKGROUND OF THE INVENTION

1. Field of the Invention

The present invention relates to a high-sensitivity semiconductor light detecting element that is less dependent on temperature and requires no film thickness control at the atomic layer level or the like.

2. Background Art

In order to make bandwidth in a semiconductor light detecting element wider, it is required to reduce the film thickness of the light absorbing layer. However, if the film thickness of the light absorbing layer is reduced (for example, InGaAs: film thickness of 0.5 μm to 2 μm), sufficient light detecting sensitivity cannot be obtained. In addition, at low temperatures, since the band gap of the light absorbing layer is larger, the sensitivity is further lowered.

It has been reported that in the semiconductor mixed crystal of the III-V group including Bi, the temperature change in the band gap becomes small together with the amount of Bi, and especially the band gap (0.6 to 1.5 eV) of InGaAsBi becomes constant to the temperature change (for example, refer to Japanese Patent Laid-Open No. 9-8405). It has also been reported that temperature characteristics of a semiconductor laser by using InGaAsBi in a layer other than the active layer is improved (for example, refer to Japanese Patent Laid-Open No. 2000-223787 and Japanese Patent Laid-Open No. 2004-221413).

A semiconductor optical element has further been reported that consists of a short period superlattice, wherein the thin film of an active layer using two kinds of III-V group semiconductors or its mixed crystal as the constitution unit, and the thin film having the largest lattice constant contains Bi (For example, refer to Japanese Patent Laid-Open No. 11-68238). For example, a short period superlattice of $(InAsBi)_m(GaAs)_n$, wherein Bi is contained in InAs having the larger lattice constant in InAs and GaAs is used as the active layer.

SUMMARY OF THE INVENTION

The short period superlattice consists of two kinds of very thin layers of atomic layer units, and the two kinds of layers are alternately stacked. The two kinds of layers include an InP substrate and a layer having a large lattice mismatch rate (the lattice mismatch rate of the InP substrate and InAsBi, and the InP substrate and GaAs are 3% or more), and are designed to have an optimal film thickness so as to achieve lattice matching with the InP substrate when formed to be the short period superlattice. The problem with the short period superlattice is that unless the film thickness is controlled in the atomic layer level, crystal defects may occur, and dark current may be increased and reliability may be deteriorated.

In addition, in the semiconductor laser in Japanese Patent Laid-Open No. 11-68238, the film thickness of the short period superlattice in $(InAsBi)_1(GaAs)_1 \times 20$ cycles is as thin as about 0.1 μm or less. When this short period superlattice is applied to the light absorbing layer of the light detecting element, sufficient light detecting sensitivity cannot be obtained due to such a thin film thickness. In order to obtain sufficient sensitivity, short period superlattice having the film thickness of 0.5 to 2 μm must be formed. However, it is difficult to control the film thickness in the atomic layer level to allow the crystal growth of the short period superlattice as thick as about 0.5 to 2 μm in stable composition.

In view of the above-described problems, an object of the present invention is to provide a high-sensitivity semiconductor light detecting element that is less dependent on temperature and requires no film thickness control at the atomic layer level or the like.

According to the present invention, a semiconductor light detecting element includes: an InP substrate; and a semiconductor stacked structure on the InP substrate and including at least a light absorbing layer, wherein the light absorbing layer includes an InGaAsBi layer lattice-matched to the InP substrate.

The present invention makes it possible to provide a high-sensitivity semiconductor light detecting element that is less dependent on temperature and requires no film thickness control at the atomic layer level or the like.

Other and further objects, features and advantages of the invention will appear more fully from the following description.

DETAILED DESCRIPTION OF THE PREFERRED EMBODIMENTS

A semiconductor light detecting element according to the embodiments of the present invention will be described with reference to the drawings. The same components will be denoted by the same symbols, and the repeated description thereof may be omitted.

First Embodiment

Figure 1:
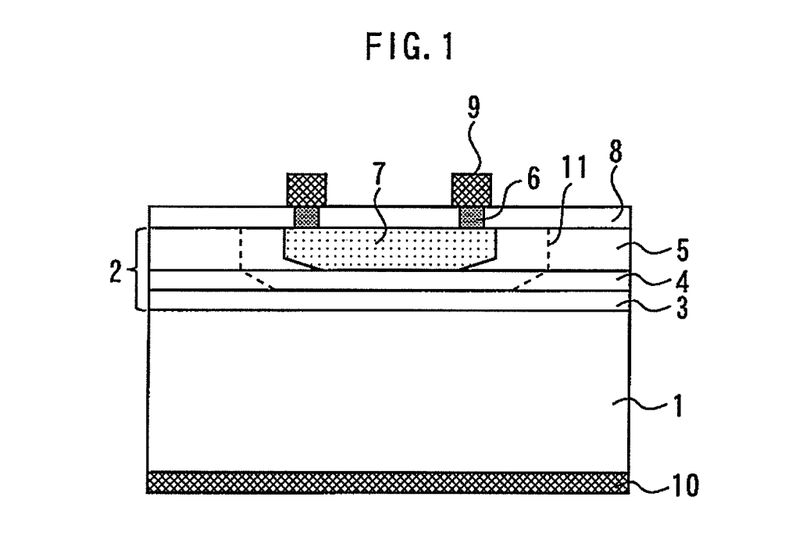
FIG. 1 is a sectional view showing a semiconductor light detecting element according to the first embodiment of the present invention.
Figure 2:
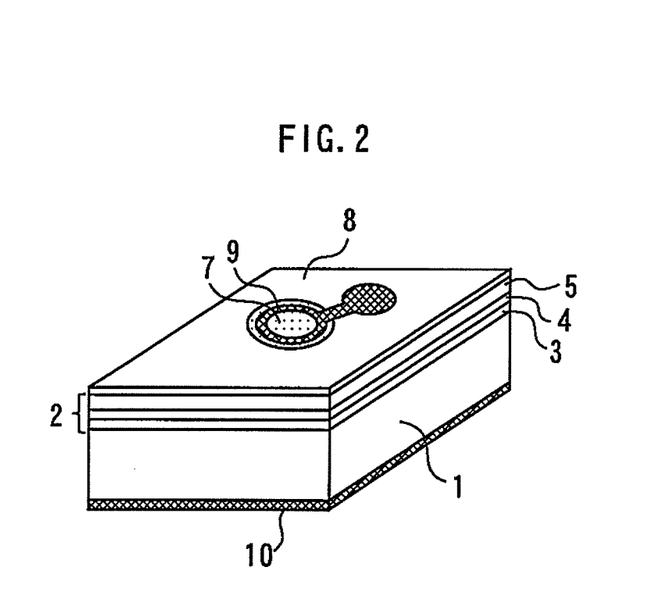
FIG. 2 is a perspective view showing a semiconductor light detecting element according to the first embodiment of the present invention.

FIG. 1 is a sectional view showing a semiconductor light detecting element according to the first embodiment of the present invention, and FIG. 2 is a perspective view thereof. On an n-type InP substrate 1 having a carrier concentration of about $5 \times 10^{18}$ cm$^{-3}$, a semiconductor stacked structure 2 is provided. The semiconductor stacked structure 2 has an n-type InP layer 3, a light absorbing layer 4 having the film thickness of 0.5 to 2 µm and formed of i-type InGaAsBi lattice-matched on the n-type InP substrate 1, an i-type InP layer 5 having the film thickness of about 2 µm, and a ring-shaped i-type InGaAs contact layer 6 having the film thickness of 0.1 to 0.5 µm and the width of 2 to 10 µm, sequentially stacked on the n-type InP substrate 1. A p-type conductive region 7 having a carrier concentration of $1 \times 10^{19}$ to $1 \times 10^{20}$ cm$^{-3}$ is provided in a part of the i-type InP layer 5. In this specification, lattice matching is intended means that the lattice mismatch rate is 0.5% or less.

A surface protecting layer 8 consisting of SiN is provided on the i-type InP layer 5. The film thickness of the surface protecting layer 8 is ¼ of the wavelength of the incident light. The surface protecting layer 8 functions as an antireflective film. A p-side electrode 9 consisting of Ti/Au, and the like is electrically connected to the p-type conductive region 7 via the i-type InGaAs contact layer 6. An n-side electrode 10 consisting of AuGe/Au is connected to the lower surface of the n-type InP substrate 1. However, the i-type InGaAs contact layer 6 can be omitted, and the p-type conductive region 7 can be directly connected to the p-side electrode 9.

Here, the wavelength of the incident light is, for example, 1.55 µm which is in the wavelength band for optical communications. Since the incident light is caused to enter from the opposite side of the n-type InP substrate 1 (hereinafter referred to as surface incidence), the band gap energy of the i-type InP layer 5 is larger than the band gap energy of the light absorbing layer 4.

Next, the method for manufacturing the semiconductor light detecting element according to the present embodiment will be briefly described. First, using a MOCVD (Metal Organic Chemical Vapor Deposition) method or the like, the n-type InP layer 3, the light absorbing layer 4, the i-type InP layer 5, and the i-type InGaAs contact layer 6 are epitaxially grown on the n-type InP substrate 1 in sequence.

Next, Zn is diffused from the surface side to a part of the i-type InP layer 5 up to the light absorbing layer 4 so as to form a p-type conductive region 7. The diffusing methods include gas-phase diffusion, thermal diffusion using masks, and the like. When thermal diffusion is performed, for example, a SiN film (not shown) and the like is first formed. An opening is formed in the region wherein the p-type conductive region 7 of the SiN film is formed. A ZnO film (not shown) or the like is formed on the SiN film including the region on the opening, and a heat treatment is performed for a prescribed time using the SiN film as a mask. In place of Zn, an impurity such as Cd and Be can also be used. Thereafter, the SiN film, the ZnO film or the like is removed. Then, the center and the exterior of the i-type InGaAs contact layer 6 are etched off, and patterned to be a ring shape.

Next, a surface protecting layer 8 is formed on the surface of the i-type InP layer 5 by a plasma CVD method or the like. In combination of photolithography and etching using fluoric acid or the like, an opening is formed in the surface protecting layer 8 in the region where a p-side electrode 9 is later formed. A photoresist film (not shown) is formed on the surface protecting layer 8, and an opening is formed in the photoresist to align with the opening of the surface protecting layer 8. Thereafter, a Ti/Au film is formed using electron beam (EB) deposition, and the unrequired portion of the Ti/Au film is lifted off together with the photoresist film to form a p-side electrode 9. At this time, a bonding pad connected to the p-side electrode 9 is simultaneously formed on the surface protecting layer 8 (not shown). Then, the lower surface of the n-type InP substrate 1 is polished to form an n-side electrode 10 on the lower surface of the n-type InP substrate 1. By the above-described process, the semiconductor light detecting element according to the present embodiment is manufactured.

Next, the basic operation of the semiconductor light detecting element according to the present embodiment will be described. From the exterior, the reverse bias wherein the n-side electrode 10 becomes plus and the p-side electrode 9 becomes minus is added. In this state, by p-n bonding formed by the p-type conductive region 7 and the n-type InP substrate 1, a depletion layer 11 is formed on the light absorbing layer 4. The incident light entering from the upper portion of the semiconductor light detecting element transmits through the surface protecting layer 8 and the p-type conductive region 7, and is absorbed by the depletion layer 11 of the light absorbing layer 4 to generate electrons and holes. These electrons and holes are attracted by the electric field, and flow toward the n-type InP substrate 1 and the p-type conductive region 7, respectively. Thereby, the generated optical current is taken out from the p-side electrode 9 and the n-side electrode 10 as the signal current.

Next, the effect of the present embodiment compared with the comparison example will be described. In the comparison example, the material of the light absorbing layer is i-type InGaAs. The band gap of the light absorbing layer is about 0.75 eV, and if the film thickness is reduced (film thickness of 0.5 to 2 µm), sufficient light detecting sensitivity cannot be obtained. Also, since the band gap is changed when the temperature changes, the light detecting sensitivity is lowered at low temperatures.

On the other hand, since the band gap of InGaAsBi in the light absorbing layer 4 of the present embodiment can be smaller than the band gap of InGaAs, a higher light detecting sensitivity than the comparison example can be obtained. For example, when the light absorbing layer is formed of $In_{0.48}Ga_{0.52}As_{0.989}Bi_{0.011}$, the band gap can be 0.69 eV. Also, since the band gap of InGaAsBi is constant to temperature change, the lowering in light detecting sensitivity at low temperature can be prevented. Furthermore, since the light absorbing layer 4 consists of a single InGaAsBi layer, the film thickness control or the like in the atomic layer level is not required. In addition, since the light absorbing layer 4 is lattice-matched to the n-type InP substrate 1, the occurrence of crystal defects can be inhibited, and the increase of dark current and the deterioration of reliability can be prevented.

In addition, the i-type InP layer 5 may be larger than the band gap of the light absorbing layer, and it is not limited to InP, but can be InGaAsP, InAlGaAs, or InAlAs. Also, the i-type InP layer 5 is not limited to one layer, but these materials can be combined to be multiple layers.

Second Embodiment

Figure 3:
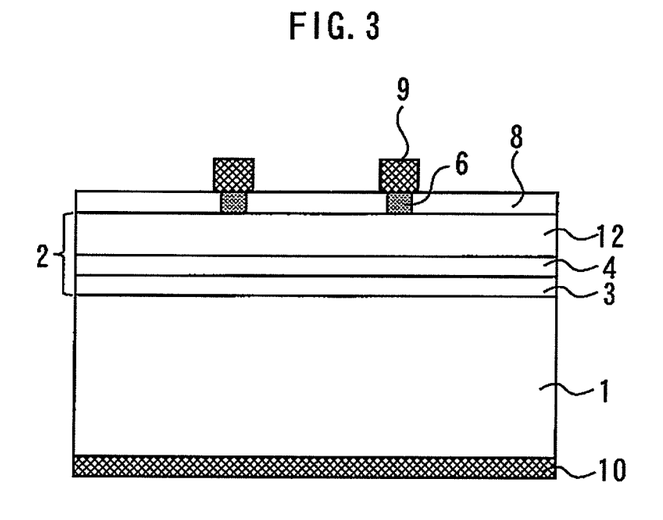
FIG. 3 is a sectional view showing a semiconductor light detecting element according to the second embodiment of the present invention.

FIG. 3 is a sectional view showing a semiconductor light detecting element according to the second embodiment of the present invention. In place of the i-type InP layer 5 and the p-type conductive region 7 in the first embodiment, a p-type InP layer 12 is provided. Thereby, the manufacturing processes become simpler than the manufacturing processes in the first embodiment. However, from the view point of dark current or reliability, the first embodiment is preferred.

Third Embodiment

Figure 4:
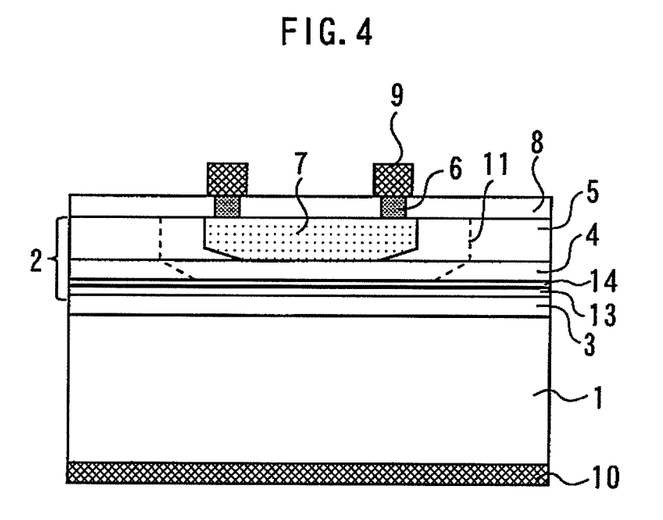
FIG. 4 is a sectional view showing a semiconductor light detecting element according to the third embodiment of the present invention.

FIG. 4 is a sectional view showing a semiconductor light detecting element according to the third embodiment of the present invention. This semiconductor light detecting element is an avalanche photo diode wherein an avalanche multiplying layer 13 and an electric field moderating layer 14, which are disposed between the n-type InP substrate 1 and the light absorbing layer 4, are added to the constitution of the first embodiment.

The avalanche multiplying layer 13 consists of i-type AlInAs having the film thickness of 0.15 to 0.4 μm. The electric field moderating layer 14 has the film thickness of 0.03 to 0.06 μm, and consists of p-type InP having the carrier concentration of 0.5 to $1\times10^{18}$ cm$^{-3}$. The avalanche multiplying layer 13 multiplies carriers formed in the light absorbing layer 4. The electric field moderating layer 14 moderates the electric field strength from the avalanche multiplying layer 13 to the light absorbing layer 4.

When the reverse bias voltage applied to the semiconductor light detecting element is sufficiently high, electrons are ionized in the avalanche multiplying layer 13, and new electron-hole pairs are generated. The newly generated electrons and holes cause further ionization, electrons and holes multiply like an avalanche (avalanche multiplying). Thereby, light detecting sensitivity can be elevated.

It is preferable here that the avalanche multiplying layer 13 consists of an AlInAsBi layer lattice-matched to the n-type InP substrate 1. Since the band gap of the AlInAsBi layer is constant to temperature change, the temperature dependence to the breakdown voltage can be lower than the AlInAs layer.

Although the electric field moderating layer 14 is formed of p-type InP in the present embodiment, p-type AlInAs can also be used. Depending on the state, the electric field moderating layer 14 can be omitted. In addition, when the avalanche multiplying layer 13 is formed of AlInAsBi, the light absorbing layer 4 can be formed of InGaAs.

Fourth Embodiment

Figure 5:
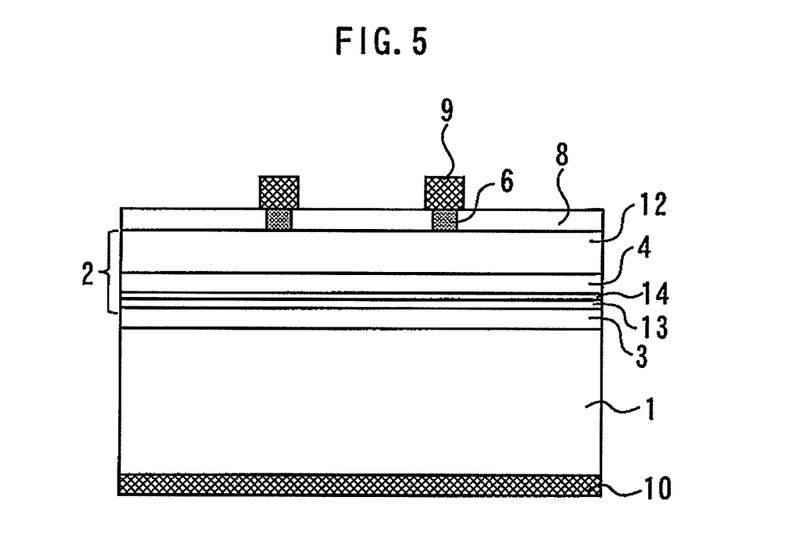
FIG. 5 is a sectional view showing a semiconductor light detecting element according to the fourth embodiment of the present invention.

FIG. 5 is a sectional view showing a semiconductor light detecting element according to the fourth embodiment of the present invention. In place of the i-type InP layer 5 and the p-type conductive region 7 in the third embodiment, a p-type InP layer 12 is provided. Thereby, the manufacturing process is simplified than the third embodiment. However, from the view point of dark current or reliability, the third embodiment is preferred.

Fifth Embodiment

Figure 6:
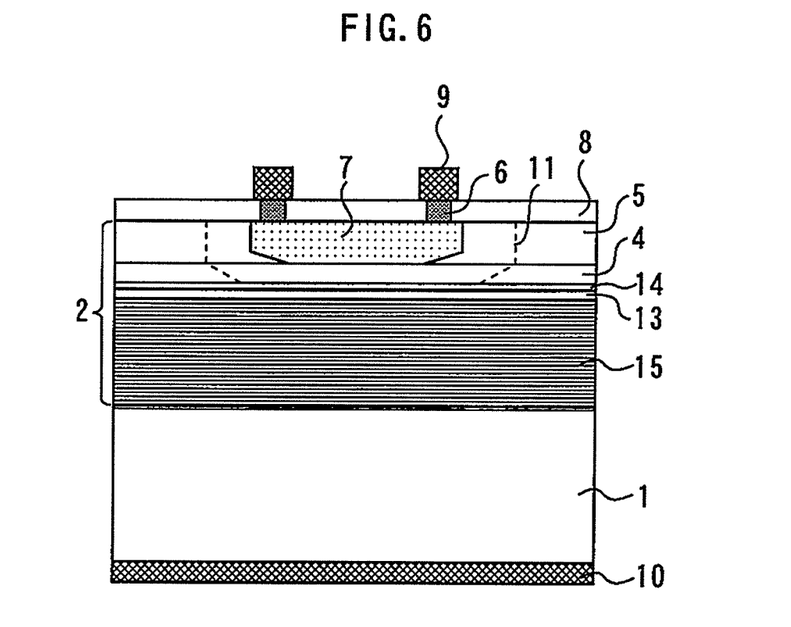
FIG. 6 is a sectional view showing a semiconductor light detecting element according to the fifth embodiment of the present invention.

FIG. 6 is a sectional view showing a semiconductor light detecting element according to the fifth embodiment of the present invention. In addition to the constitution of the third embodiment, a multilayer reflecting film 15 is provided between the n-type InP substrate 1 and the light absorbing layer 4. In the incident light entering into the semiconductor light detecting element, light transmitted without being absorbed in the light absorbing layer 4 is reflected by the multilayer reflecting film 15, and is returned to the InGaAs light absorbing layer 4 again and absorbed. As a result, light detecting sensitivity is improved.

Sixth Embodiment

Figure 7:
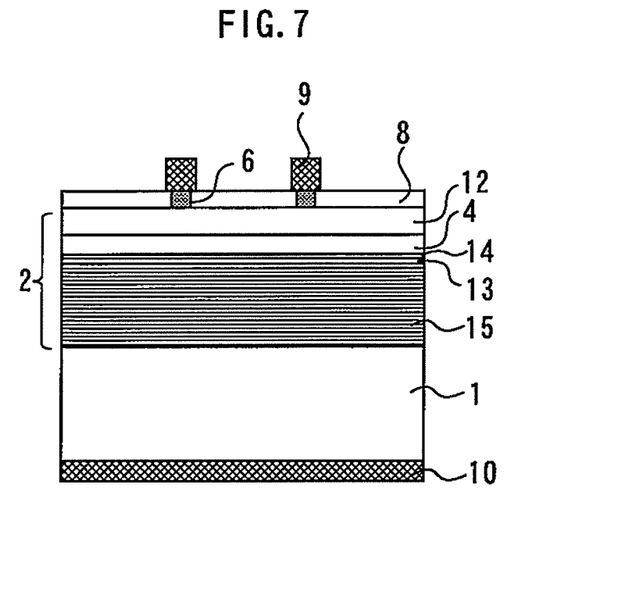
FIG. 7 is a sectional view showing a semiconductor light detecting element according to the sixth embodiment of the present invention.

FIG. 7 is a sectional view showing a semiconductor light detecting element according to the sixth embodiment of the present invention. In place of the i-type InP layer 5 and the p-type conductive region 7 in the fifth embodiment, a p-type InP layer 12 is provided. Thereby, the manufacturing process is simplified than the manufacturing process in the fifth embodiment. However, from the view point of dark current or reliability, the fifth embodiment is preferred.

Seventh Embodiment

Figure 8:
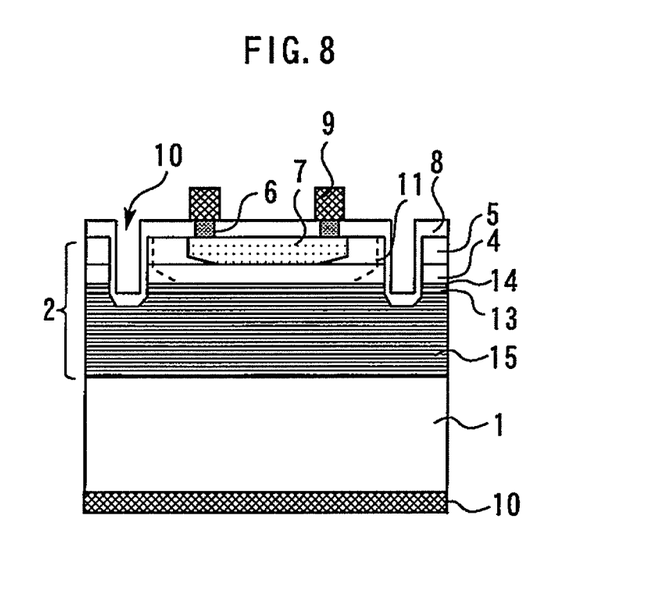
FIG. 8 is a sectional view showing a semiconductor light detecting element according to the seventh embodiment of the present invention.

FIG. 8 is a sectional view showing a semiconductor light detecting element according to the seventh embodiment of the present invention. In addition to the constitution of the fifth embodiment, a trench 16 is formed in the semiconductor stacked structure 2 so as to surround the p-type conductive region 7 and a part of the i-type InP layer 5 surrounding the region. The trench 16 is provided at least on the light absorbing layer 4, the electric field moderating layer 14, and the avalanche multiplying layer 13, and in the trench 16, the side faces of these layers are formed. Thereby, an avalanche semiconductor light detecting element which is low in dark current and high in long period reliability can be obtained.

Eighth Embodiment

Figure 9:
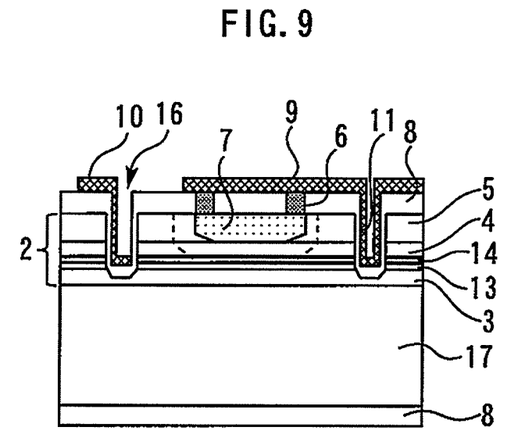
FIG. 9 is a sectional view showing a semiconductor light detecting element according to the eighth embodiment of the present invention.
Figure 10:
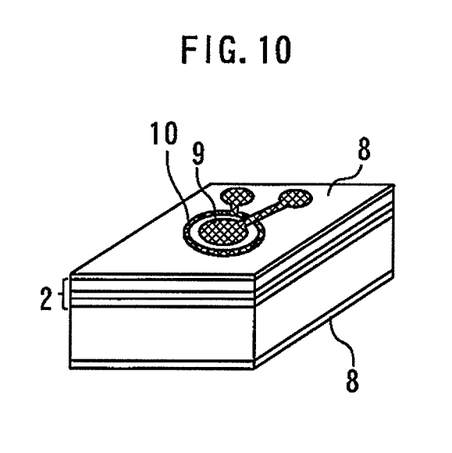
FIG. 10 is a perspective view showing a semiconductor light detecting element according to the eighth embodiment of the present invention.

FIG. 9 is a sectional view showing a semiconductor light detecting element according to the eighth embodiment of the present invention, and FIG. 10 is a perspective view thereof.

A semiconductor stacked structure 2 is provided on a semi-insulating Fe—InP substrate 17. The semiconductor stacked structure 2 has an n-type InP layer 3, an avalanche multiplying layer 13 consisting of AlInAsBi, a p-type InP electric field moderating layer 14 having the film thickness of 0.03 to 0.06 μm and the carrier concentration of 0.5 to $1\times10^{18}$ cm$^{-3}$, a light absorbing layer 4 having the film thickness of 0.5 to 2 μm and consisting of an i-type InGaAsBi, an i-type InP layer 5 having the film thickness of about 2 and a ring-shaped i-type InGaAs contact layer 6 having the film thickness of 0.1 to 0.5 μm and the width of 2 to 10 μm, sequentially stacked on an n-type InP substrate 1. A p-type conductive region 7 having the carrier concentration of $1\times10^{19}$ to $1\times10^{20}$ cm$^{-3}$ is provided in a part of the i-type InP layer 5.

A trench 16 is formed in the semiconductor stacked structure 2 so as to surround the p-type conductive region 7 and a part of the i-type InP layer 5 surrounding the region. Surface protecting layers 8 consisting of SiN are provided on the i-type InP layer 5 and on a lower surface of the semi-insulating Fe—InP substrate 17. A p-side electrode 9 consisting of Ti/Au or the like is electrically connected to the p-type conductive region 7 via the i-type InGaAs contact layer 6. An n-side electrode 10 consisting of AuGe/Au is connected to the n-type InP layer 3 through the trench 16.

Incident light entering from the back face of the semi-insulating Fe—InP substrate 17 and transmitting without being absorbed in the light absorbing layer 4 is reflected by the p-side electrode 9, and returns again to and is absorbed in the InGaAs light absorbing layer 4.

The present invention can also be applied to the avalanche semiconductor light detecting element by which incident light enters from the back face of the semi-insulating Fe—InP substrate 17 as in the present embodiment, and can obtain the same effects in other embodiments.

Ninth Embodiment

Figure 11:
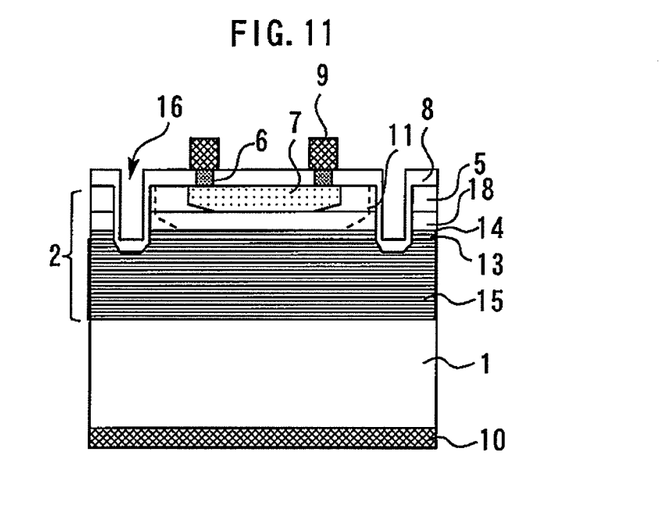
FIG. 11 is a sectional view showing a semiconductor light detecting element according to the ninth embodiment of the present invention.
Figure 12:
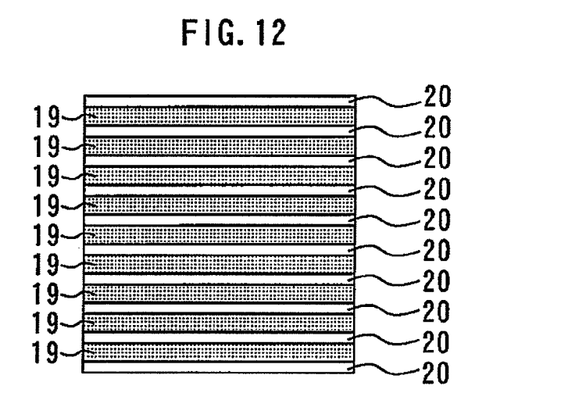
FIG. 12 is a sectional view showing a light absorbing layer of the elements in FIG. 11.

FIG. 11 is a sectional view showing a semiconductor light detecting element according to the ninth embodiment of the present invention. FIG. 12 is a sectional view showing a light absorbing layer of the elements in FIG. 11. As different from the seventh embodiment, a light absorbing layer 18 is a multilayer structure wherein an InGaAsBi layer 19 lattice-matched to the n-type InP substrate 1 and an InGaAs layer 20 lattice-matched to the n-type InP substrate 1 are alternately stacked. Since the light absorbing layer 18 is lattice-matched to the n-type InP substrate 1, the occurrence of crystal defects are inhibited, and the increase of dark currents and the deterioration of reliability can be prevented.

Specifically, eight pairs of the InGaAsBi layer 19 having the film thickness of 70 nm and the InGaAs layer 20 having film thickness of 30 nm are alternately stacked, and the first and last layers are formed of InGaAs. However, the film thickness and the pair number of these layers are not limited to the above-described example, but can be suitably set according to the required sensitivity and the bandwidth.

As described above, the multilayer structure of the InGaAsBi layer 19 and the InGaAs layer 20 lattice-matched to the n-type InP substrate 1 requires no control of film thickness in the atomic layer level or the like, and eliminates concern of the increase in dark current or the deterioration of reliability.

In addition, by forming the multilayer structure of InGaAs and InGaAsBi, the crystallinity of InGaAsBi of harder growth than InGaAs can be improved. As a result, surface roughing in epitaxial growth can be alleviated.

Tenth Embodiment

Figure 13:
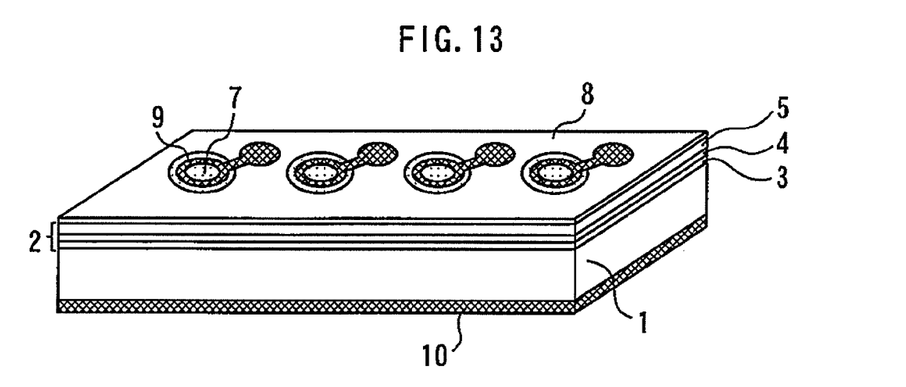
FIG. 13 is a perspective view showing a semiconductor light detecting element according to the tenth embodiment of the present invention.

FIG. 13 is a perspective view showing a semiconductor light detecting element according to the tenth embodiment of the present invention. In the present embodiment, the semiconductor light detecting elements in the first embodiment are arrayed. Not only this, semiconductor light detecting elements in the second to ninth embodiments can also be arrayed.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-026150, filed on Feb. 9, 2012, including specification, claims, drawings, and summary, on which the Convention priority of the present application is based, is incorporated herein by reference in its entirety.

What is claimed is:

1. A semiconductor light detecting element comprising:
an InP substrate; and
a semiconductor stacked structure on the InP substrate and including at least a light absorbing layer, wherein the light absorbing layer includes an InGaAsBi layer lattice-matched to the InP substrate.

2. The semiconductor light detecting element according to claim 1, wherein the light absorbing layer consists of the single InGaAsBi layer.

3. The semiconductor light detecting element according to claim 1, wherein the light absorbing layer is a multilayer structure in which the InGaAsBi layer and an InGaAs layer, lattice-matched to the InP substrate, are alternately stacked.

4. The semiconductor light detecting element according to claim 1, wherein the semiconductor stacked structure includes an avalanche multiplying layer and an electric field moderating layer located between the InP substrate and the light absorbing layer.

5. The semiconductor light detecting element according to claim 4, wherein the avalanche multiplying layer consists of an AlInAsBi layer lattice-matched to the InP substrate.

6. The semiconductor light detecting element according to claim 1, wherein band gap energy of the light absorbing layer does not exceed 0.75 eV.

7. A semiconductor light detecting element comprising:
an InP substrate; and
a semiconductor stacked structure on the InP substrate, wherein
the semiconductor stacked structure includes
an avalanche multiplying layer,
an electric field moderating layer, and
a light absorbing layer, sequentially stacked on the InP substrate, and
the avalanche multiplying layer consists of an AlInAsBi layer lattice-matched to the InP substrate.

8. The semiconductor light detecting element according to claim 1, wherein the semiconductor stacked structure includes:
a semiconductor layer on the light absorbing layer and having a larger band gap energy than the light absorbing layer, and
a conductive region in the semiconductor layer.

9. The semiconductor light detecting element according to claim 7, wherein the semiconductor stacked structure includes:
a semiconductor layer on the light absorbing layer and having a larger band gap energy than the light absorbing layer, and
a conductive region in the semiconductor layer.

10. The semiconductor light detecting element according to claim 8, including a trench located in the semiconductor stacked structure and surrounding the conductive region.

11. The semiconductor light detecting element according to claim 9, including a trench located in the semiconductor stacked structure and surrounding the conductive region.

12. The semiconductor light detecting element according to claim 1, wherein the semiconductor stacked structure includes a multilayer reflecting film located between the InP substrate and the light absorbing layer.

13. The semiconductor light detecting element according to claim 7, wherein the semiconductor stacked structure includes a multilayer reflecting film located between the InP substrate and the light absorbing layer.

* * * * *